United States Patent
Lin et al.

(10) Patent No.: US 10,349,558 B2
(45) Date of Patent: Jul. 9, 2019

(54) METHOD OF MANUFACTURING HEAT DISSIPATING DEVICE

(71) Applicant: Cooler Master (Hui Zhou) Co., Ltd., Huizhou, Guangdong Province (CN)

(72) Inventors: Chia-Yu Lin, Huizhou (CN); Qingsong Zhang, Huizhou (CN); Tao Song, Huizhou (CN)

(73) Assignee: Cooler Master (Hui Zhou) Co., Ltd., Guangdong Province (CN)

( * ) Notice: Subject to any disclaimer, the term of this patent is extended or adjusted under 35 U.S.C. 154(b) by 179 days.

(21) Appl. No.: 15/594,661

(22) Filed: May 15, 2017

(65) Prior Publication Data
US 2017/0251570 A1    Aug. 31, 2017

Related U.S. Application Data

(62) Division of application No. 14/503,419, filed on Oct. 1, 2014, now abandoned.

(30) Foreign Application Priority Data

Nov. 25, 2013   (CN) .................. 2013 2 07517062 U

(51) Int. Cl.
*B21D 53/02*         (2006.01)
*H05K 7/20*          (2006.01)
(Continued)

(52) U.S. Cl.
CPC ..... *H05K 7/20336* (2013.01); *F28D 15/0233* (2013.01); *F28F 1/32* (2013.01);
(Continued)

(58) Field of Classification Search
CPC ... H05K 7/20336; H05K 7/2039; F28F 1/325; F28F 1/32; F28F 2275/127; F28F 2275/122; F28D 15/0233; H01L 2924/0002; H01L 21/4882; H01L 23/3672; H01L 23/427
See application file for complete search history.

(56) References Cited

U.S. PATENT DOCUMENTS 7,120,026 B2 * 10/2006 Chen .................. H01L 23/3672
                                                    361/704
2003/0155104 A1    8/2003 Wenger
(Continued)

*Primary Examiner* — Ryan J. Walters
(74) *Attorney, Agent, or Firm* — Alan D. Kamrath; Mayer & Williams PC

(57) ABSTRACT

A method of manufacturing a heat dissipating device includes steps of providing a heat dissipating fin and a heat pipe. The heat dissipating fin includes a fin body, a through hole and a collar portion, with the through hole formed on the fin body, with the collar portion extending from a periphery of the through hole and having a first U-shaped protruding ear, with the first U-shaped protruding ear having a first opening, with the heat pipe having a heat dissipating end and a heat absorbing end, and with the heat dissipating end opposite to the heat absorbing end; inserting the heat dissipating end into the through hole and the collar portion; and punching the collar portion to shrink the first opening of the first U-shaped protruding ear, such that the collar portion fixes the heat dissipating end in a tight-fitting manner.

5 Claims, 6 Drawing Sheets

(51) Int. Cl.
    *F28D 15/02*         (2006.01)
    *F28F 1/32*          (2006.01)
    *H01L 23/427*      (2006.01)
    *H01L 23/367*      (2006.01)
    *H01L 21/48*       (2006.01)

(52) U.S. Cl.
    CPC ............ *F28F 1/325* (2013.01); *H05K 7/2039* (2013.01); *F28F 2275/122* (2013.01); *F28F 2275/127* (2013.01); *H01L 21/4882* (2013.01); *H01L 23/3672* (2013.01); *H01L 23/427* (2013.01); *H01L 2924/0002* (2013.01)

(56) References Cited

U.S. PATENT DOCUMENTS

| | | | |
|---|---|---|---|
| 2006/0070721 A1* | 4/2006 | Chen | F28D 15/0275 165/80.3 |
| 2007/0030654 A1 | 2/2007 | Lee | |
| 2007/0284083 A1 | 12/2007 | Sung | |
| 2012/0317811 A1* | 12/2012 | Zhang | H01L 23/3672 29/890.03 |
| 2013/0025830 A1 | 1/2013 | Lin | |

\* cited by examiner

METHOD OF MANUFACTURING HEAT DISSIPATING DEVICE

CROSS REFERENCE TO RELATED APPLICATIONS

This is a divisional application of Ser. No. 14/503,419 filed on Oct. 1, 2014, now abandoned.

BACKGROUND OF THE INVENTION

1. Field of the Invention

The invention relates to a method of manufacturing a heat dissipating device and, more particularly, to a method of manufacturing a heat dissipating device utilizing a collar portion to fix a heat pipe on a heat dissipating fin.

2. Description of the Prior Art

A heat dissipating device is a significant component for electronic products. When an electronic product is operating, the current in a circuit will generate unnecessary heat due to impedance. If the heat is accumulated in the electronic components of the electronic product without dissipating immediately, the electronic components may get damaged due to the accumulated heat. Therefore, the performance of a heat dissipating device is a significant issue for the electronic product.

So far, the heat dissipating device used in the electronic product usually consists of a heat pipe, a heat dissipating fin and a heat dissipating fan. One end of the heat pipe contacts the electronic component, which generates heat during operation, the other end of the heat pipe is connected to the heat dissipating fin, and the heat dissipating fan blows air to the heat dissipating fin, to dissipate heat. In the prior art, there are two methods for connecting the heat pipe and the heat dissipating fin, as follows. The first method is to fix the heat pipe in a through hole of the heat dissipating fin directly in a tight-fitting manner. However, when the heat pipe is inserted into the through hole by the first method, the heat pipe and the heat dissipating fin may pull and drag each other, such that a surface of the heat pipe may be scratched, the heat dissipating fin may deform, or the through hole may crack. Accordingly, the yield rate of the first method is low. The second method is to connect the heat pipe and the through hole of the heat dissipating fin in a loose-fitting manner, and a thermal conductive adhesive or a solder paste is filled in a gap between the heat pipe and the heat dissipating fin. The second method has to form a groove on each of the heat dissipating fins to communicate with the through holes and to then fill the thermal conductive adhesive or the solder paste in the groove. Afterward, the heat pipe is inserted into the through hole. Then, the thermal conductive adhesive or the solder paste is heated to be converted from solid into liquid and then cooled to be converted from liquid into solid, such that the thermal conductive adhesive or the solder paste fills in the gap between the heat pipe and the heat dissipating fin. However, the process of the second method is complicated and additional theimal conductive adhesive or solder paste may remain on the heat dissipating fin, such that the appearance is not good and such that the thermal impedance increases accordingly. Furthermore, the manufacturing time is long, so the manufacturing efficiency is low.

SUMMARY OF THE INVENTION

The invention provides a method of manufacturing a heat dissipating device utilizing a collar portion to fix a heat pipe on a heat dissipating fin, to solve the aforesaid problems.

According to an embodiment of the invention, a method of manufacturing a heat dissipating device comprises steps of providing a heat dissipating fin and a heat pipe. The heat dissipating fin comprises a fin body, a through hole and a collar portion. The through hole is formed on the fin body. The collar portion extends from a periphery of the through hole and has a first surrounding portion and a first U-shaped protruding ear. Two ends of the first surrounding portion are connected to the first U-shaped protruding ear. The first U-shaped protruding ear has a first opening. The heat pipe has a heat dissipating end and a heat absorbing end, and the heat dissipating end is opposite to the heat absorbing end. The method further includes inserting the heat dissipating end into the through hole and the collar portion; and punching the collar portion to shrink the first opening of the first CT-shaped protruding ear, such that the collar portion fixes the heat dissipating end in a tight-fitting manner.

As mentioned above, the invention utilizes the collar portion to fix the heat pipe on the heat dissipating fin through a punching process. An operator may insert the heat dissipating end of the heat pipe into the through hole and the collar portion of the heat dissipating fin in a loose-fitting manner and then punch the collar portion. After punching the collar portion, the opening of the CT-shaped protruding ear of the collar portion shrinks, such that the collar portion fixes the heat dissipating end of the heat pipe in the tight-fitting manner. Accordingly, the invention can connect the heat pipe and the heat dissipating fin tightly and improve the yield rate and the efficiency of manufacturing the heat dissipating device.

These and other objectives of the present invention will no doubt become obvious to those of ordinary skill in the art after reading the following detailed description of the preferred embodiments that are illustrated in the various figures and drawings.

DETAILED DESCRIPTION

Figure 1:
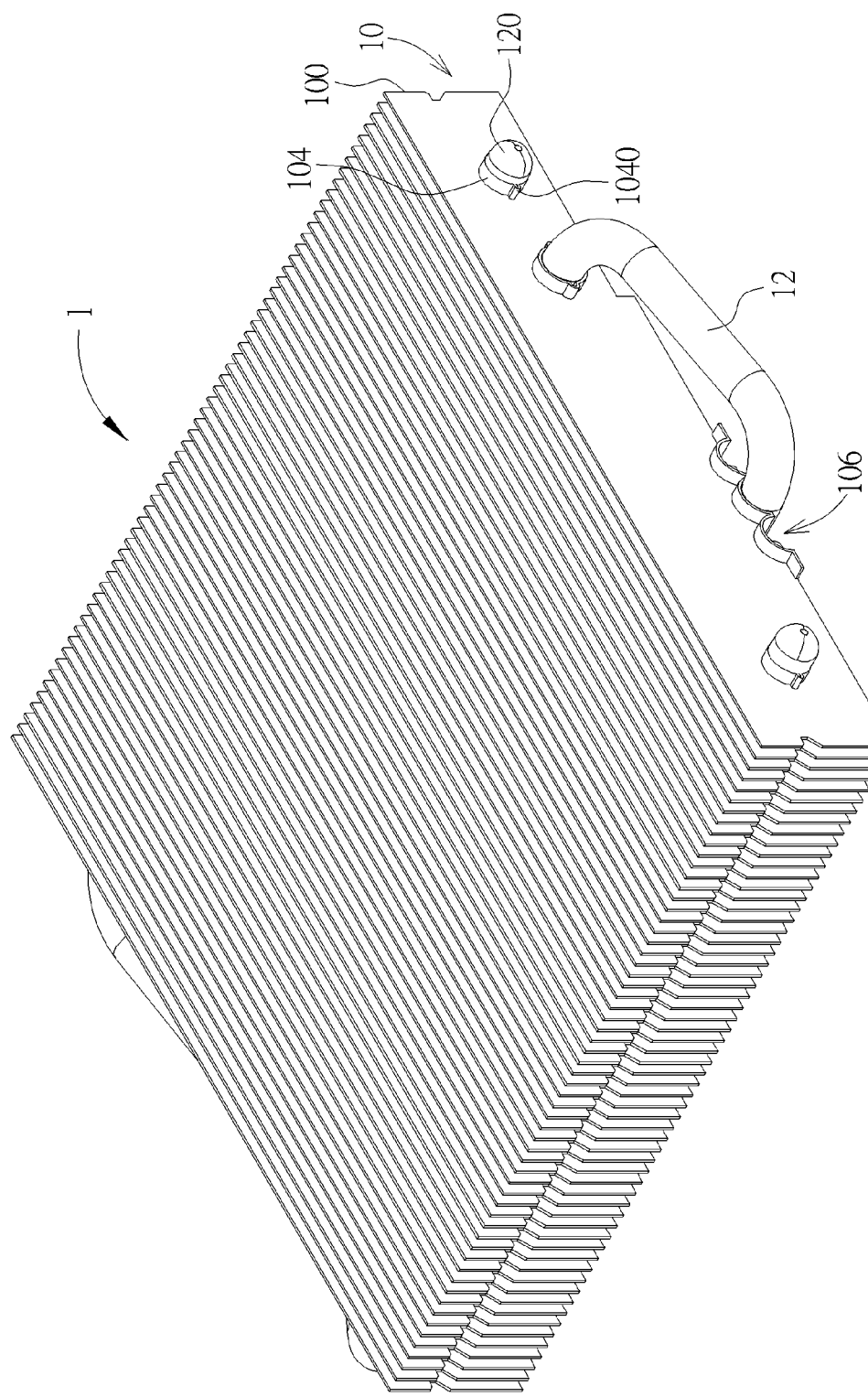
FIG. 1 is a perspective view illustrating a heat dissipating device according to a first embodiment of the invention.
Figure 2:
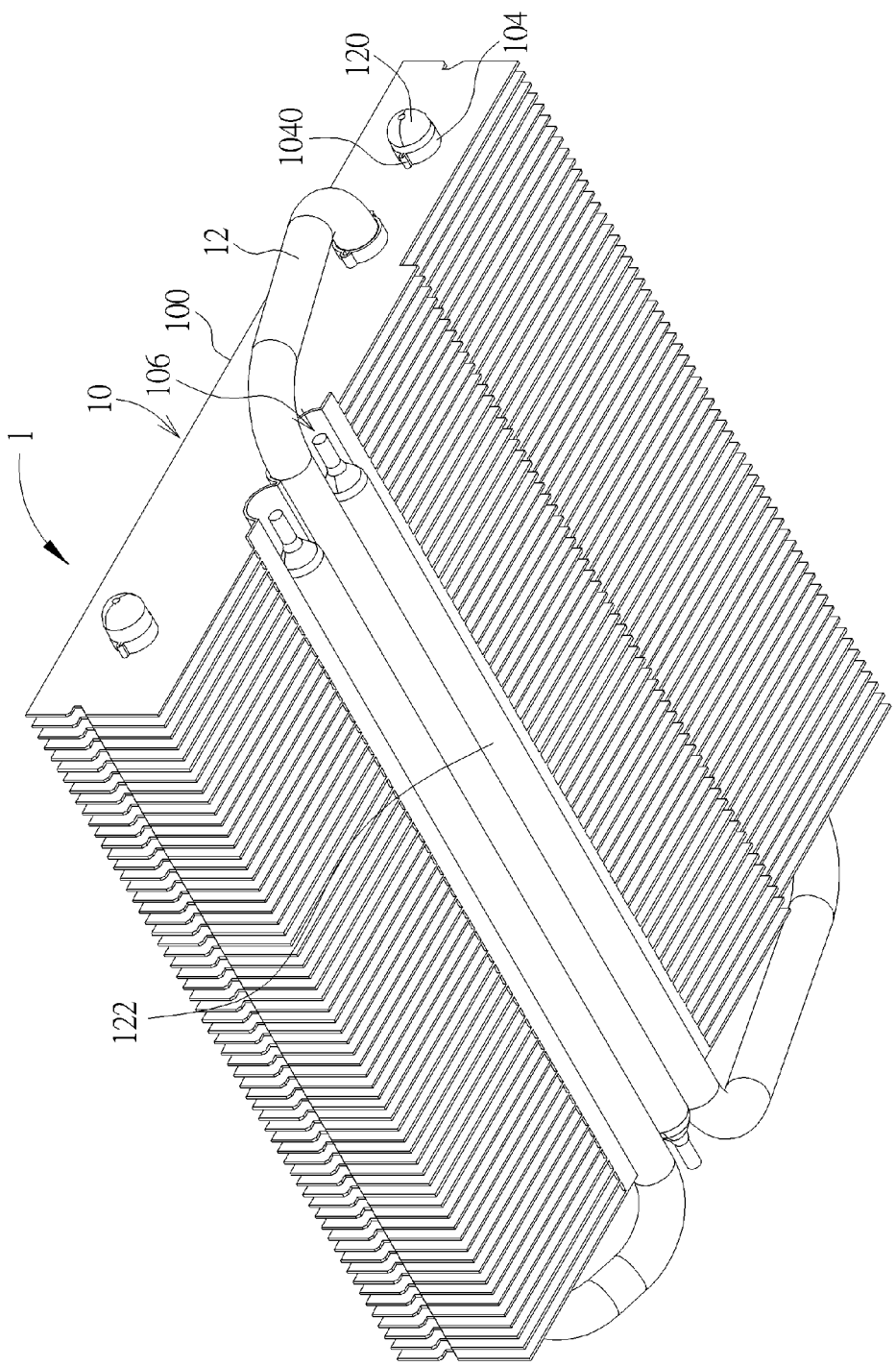
FIG. 2 is a perspective view illustrating the heat dissipating device shown in FIG. 1 from another viewing angle.
Figure 3:
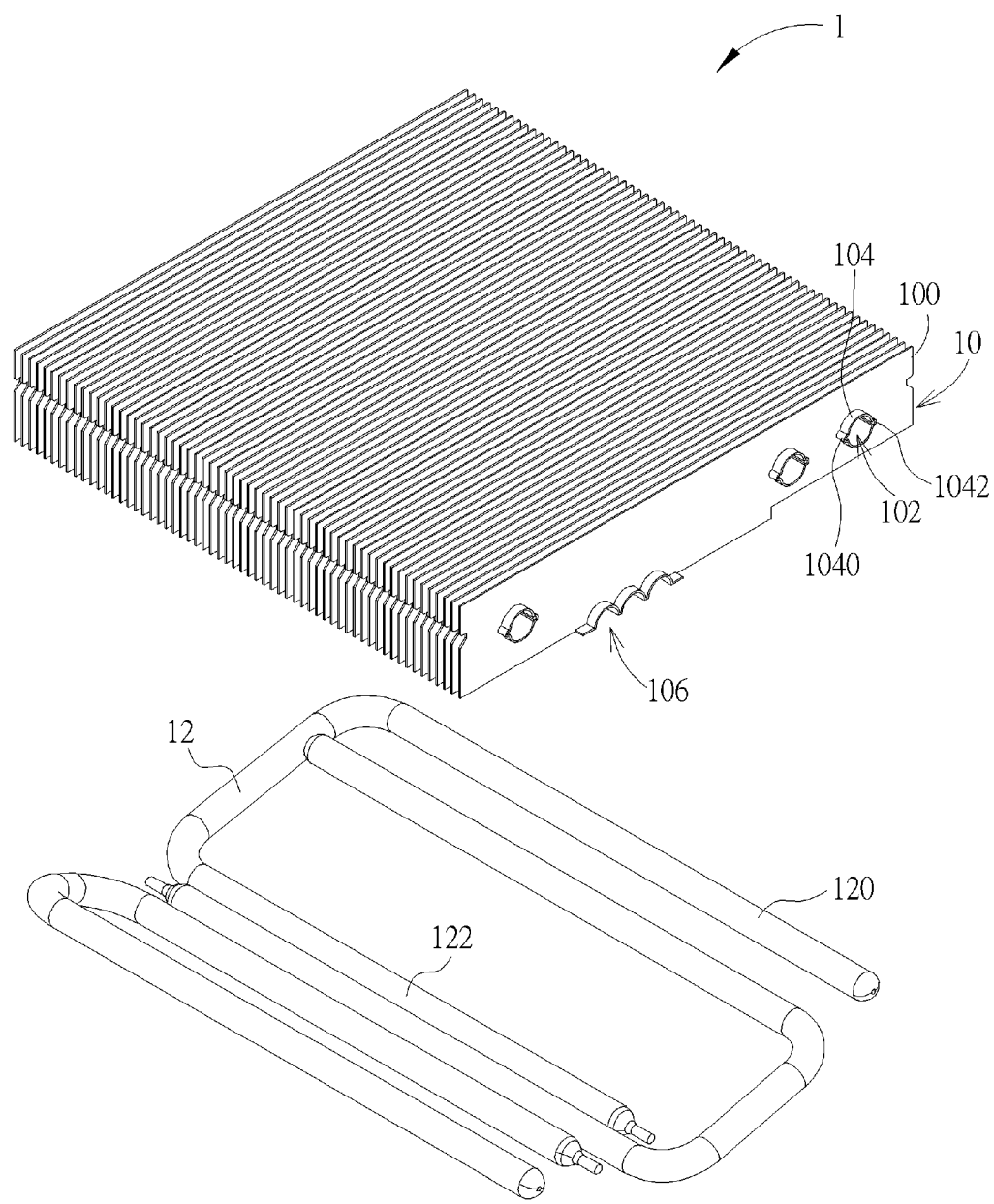
FIG. 3 is an exploded view illustrating the heat dissipating device shown in FIG. 1 before a punching process.
Figure 4:
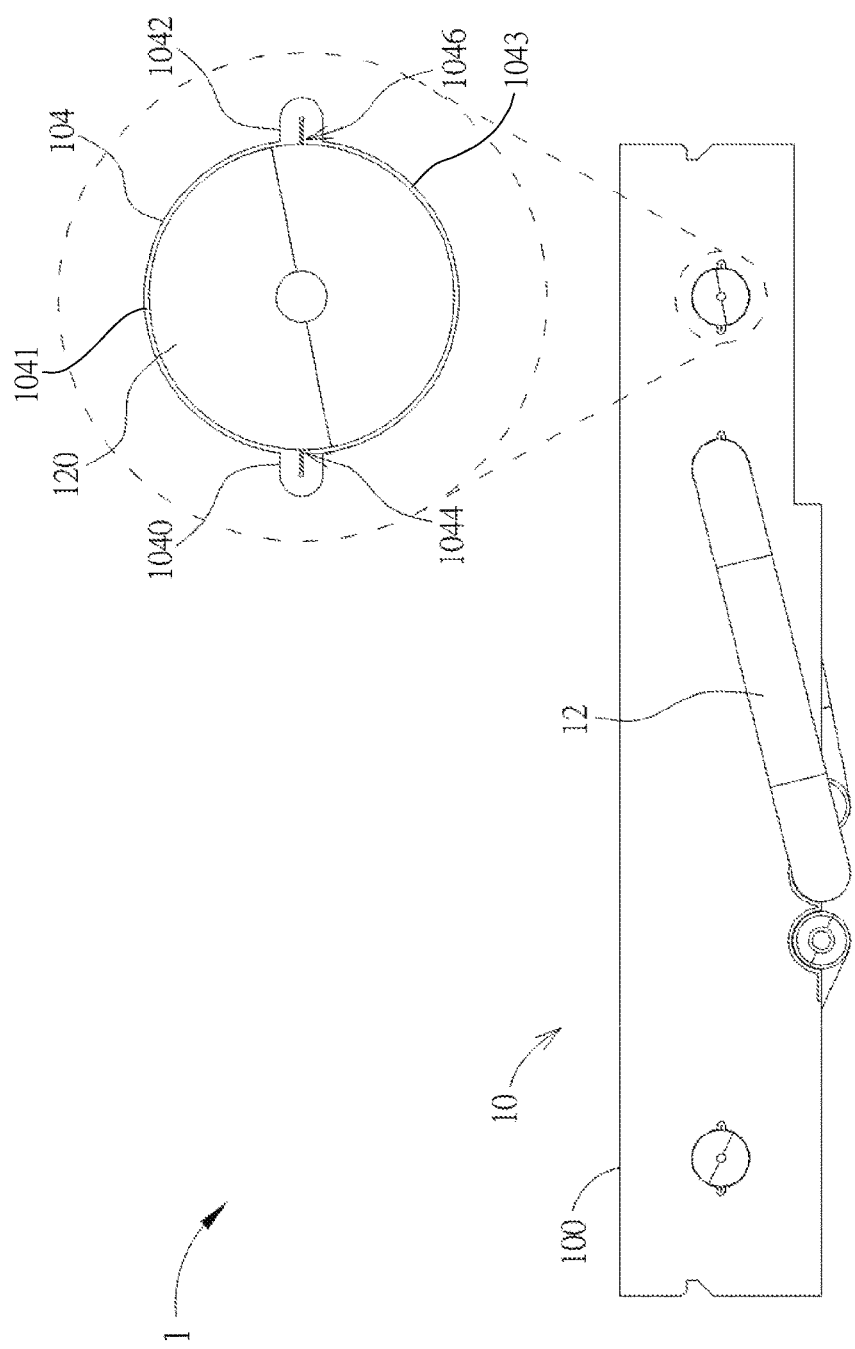
FIG. 4 is a front view illustrating the heat dissipating device shown in FIG. 1.
Figure 5:
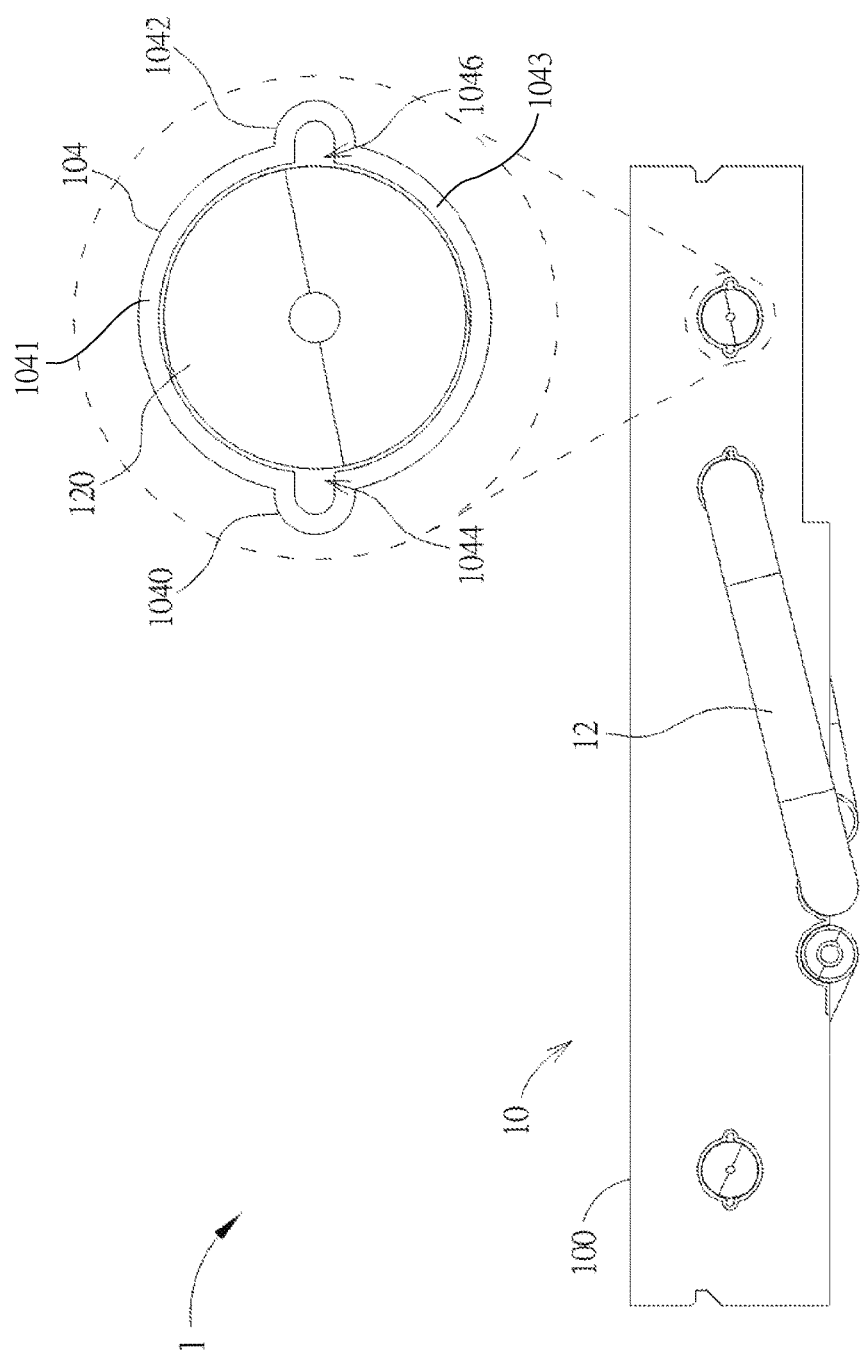
FIG. 5 is a front view illustrating the heat dissipating device shown in FIG. 4 before the punching process.

Referring to FIGS. 1 to 5, FIG. 1 is a perspective view illustrating a heat dissipating device 1 according to a first embodiment of the invention, FIG. 2 is a perspective view illustrating the heat dissipating device 1 shown in FIG. 1 from another viewing angle, FIG. 3 is an exploded view illustrating the heat dissipating device 1 shown in FIG. 1 before a punching process, FIG. 4 is a front view illustrating the heat dissipating device 1 shown in FIG. 1, and FIG. 5 is a front view illustrating the heat dissipating device 1 shown in FIG. 4 before the punching process.

As shown in FIGS. 1 to 4, the heat dissipating device 1 of the invention comprises a plurality of heat dissipating fins 10 and a plurality of heat pipes 12. The number of the heat dissipating fins 10 and the number of the heat pipes 12 can be determined according to practical applications and are not limited to the embodiment shown in FIGS. 1 to 3. The heat dissipating fin 10 comprises a fin body 100, a plurality of through holes 102, a plurality of collar portions 104 and a plurality of recesses 106. The through holes 102 and the recesses 106 are formed on the fin body 100, and the collar portions 104 extend from a periphery of the through holes 102. It should be noted that the number of the through holes 102, the number of the collar portions 104 and the number of the recesses 106 can be determined according to practical applications and are not limited to the embodiment shown in FIGS. 1 to 3.

In this embodiment, the collar portion 104 has a first U-shaped protruding ear 1040, a first surrounding portion 1041, a second U-shaped protruding ear 1042 and a second surrounding portion 1043. The first U-shaped protruding ear 1040 connects one end of the first surrounding portion 1041 and one end of the second surrounding portion 1043, and the second U-shaped protruding ear 1042 connects another end of the first surrounding portion 1041 and another end of the second surrounding portion 1043. The first U-shaped protruding ear 1040 is opposite to the second U-shaped protruding ear 1042. As shown in FIG. 5, before punching the collar portion 104, the first U-shaped protruding ear 1040 has a first opening 1044 and the second U-shaped protruding ear 1042 has a second opening 1046.

The heat pipe 12 has a heat dissipating end 120 and a heat absorbing end 122. The heat dissipating end 120 is opposite to the heat absorbing end 122. It should be noted that the structure and the principle of the heat pipe 12 are well known by one skilled in the art, so the related explanation will not be depicted herein.

As shown in FIG. 5, an operator may insert the heat dissipating end 120 of the heat pipe 12 into the through hole 102 and the collar portion 104 of the heat dissipating fin 10 in a loose-fitting manner and fix the heat absorbing end 122 of the heat pipe 12 in the recess 106 by welding, engaging or other manners. Afterward, the collar portion 104 is punched. As shown in FIG. 4, after punching the collar portion 104, the first opening 1044 of the first U-shaped protruding ear 1040 and the second opening 1046 of the second U-shaped protruding ear 1042 of the collar portion 104 shrink, such that the collar portion 104 fixes the heat dissipating end 120 of the heat pipe 12 in a tight-fitting manner. Accordingly, the invention can connect the heat pipe 12 and the heat dissipating fin 10 tightly and improve the yield rate and the efficiency of manufacturing the heat dissipating device 1.

Figure 6:
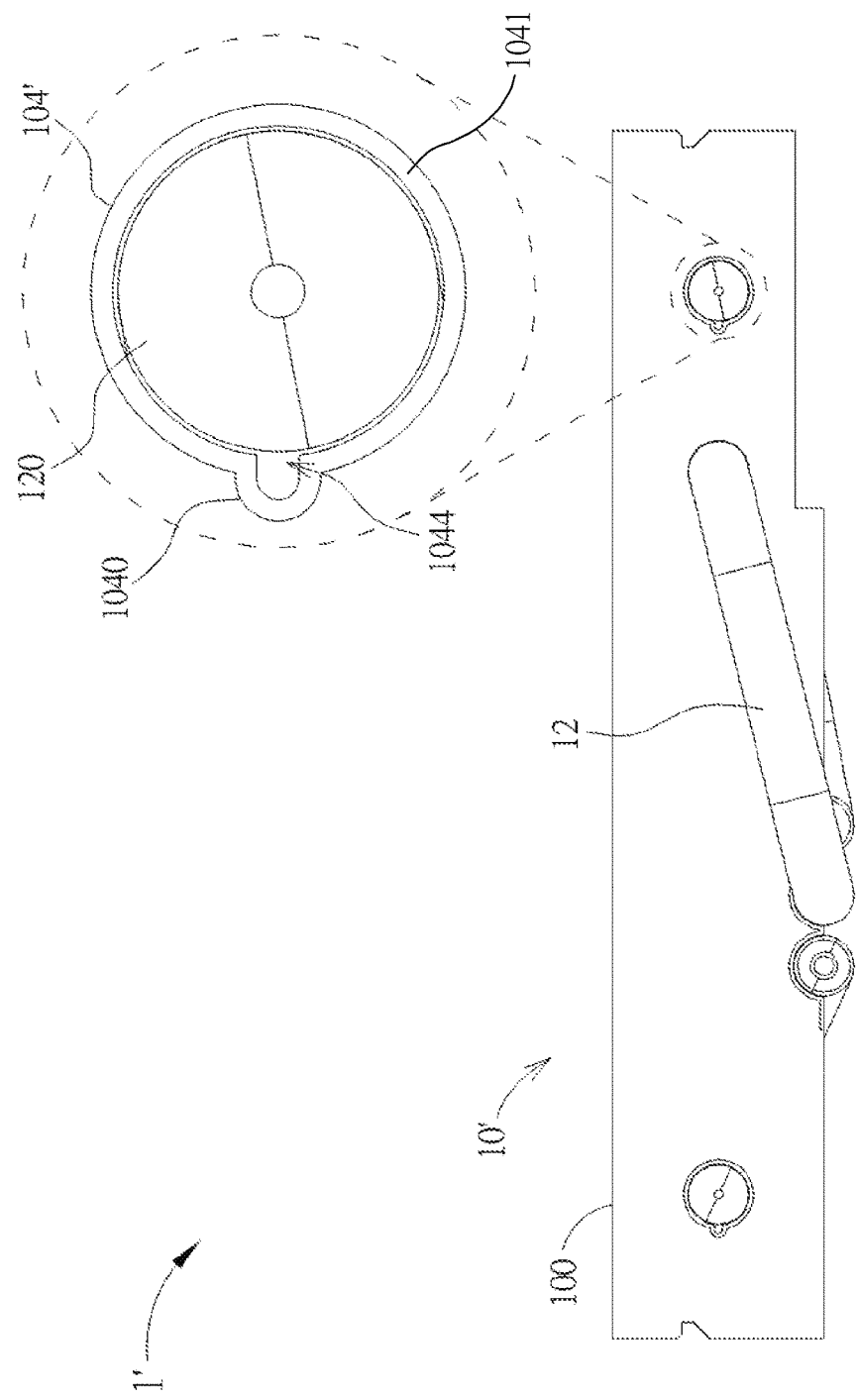
FIG. 6 is a front view illustrating a heat dissipating device before the punching process according to a second embodiment of the invention.

Referring to FIG. 6 along with FIG. 5, FIG. 6 is a front view illustrating a heat dissipating device 1' before the punching process according to a second embodiment of the invention. The difference between the heat dissipating device 1' and the aforesaid heat dissipating device 1 is that the collar portion 104' of the heat dissipating fin 10' of the heat dissipating device 1' only has the first U-shaped protruding ear 1040 and the first surrounding portion 1041 without the aforesaid second U-shaped protruding ear 1042 and the second surrounding portion 1043. It should be noted that the same elements in FIG. 6 and FIG. 5 are represented by the same numerals, so the repeated explanation will not be depicted herein again.

As mentioned above, the invention utilizes the collar portion to fix the heat pipe on the heat dissipating fin through a punching process. An operator may insert the heat dissipating end of the heat pipe into the through hole and the collar portion of the heat dissipating fin in a loose-fitting manner and then punch the collar portion. After punching the collar portion, the opening of the U-shaped protruding ear of the collar portion shrinks, such that the collar portion fixes the heat dissipating end of the heat pipe in the tight-fitting manner. Accordingly, the invention can connect the heat pipe and the heat dissipating fin tightly and improve the yield rate and the efficiency of manufacturing the heat dissipating device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a heat dissipating device comprising:

providing a heat dissipating fin and a heat pipe, with the heat dissipating fin comprising a fin body, a through hole and a collar portion, with the through hole formed on the fin body, with the collar portion extending from a periphery of the through hole and having a first surrounding portion and a first U-shaped protruding ear protruding radially from the periphery of the through hole, with two ends of the first surrounding portion respectively connected to two ends of the first U-shaped protruding ear, with the first U-shaped protruding ear having a first opening, with the heat pipe having a heat dissipating end and a heat absorbing end, and with the heat dissipating end opposite to the heat absorbing end;

inserting the heat dissipating end into the through hole and the collar portion;

punching the collar portion to shrink the first opening of the first U-shaped protruding ear; and fixing the heat dissipating end in a tight-fitting manner by the collar portion.

2. The method of claim 1, wherein the heat dissipating fin further comprises a recess formed on the fin body, and wherein the method further comprises:

fixing the heat absorbing end in the recess.

3. A method of manufacturing a heat dissipating device comprising:

providing a heat dissipating fin and a heat pipe, with the heat dissipating fin comprising a fin body, a through hole and a collar portion, with the through hole formed on the fin body, with the collar portion extending from a periphery of the through hole and having a first surrounding portion, a first U-shaped protruding ear protruding radially from the periphery of the through hole, a second surrounding portion and a second U-shaped protruding ear protruding radially from the periphery of the through hole and opposite to the first U-shaped protruding ear, with two ends of the first U-shaped protruding ear respectively connecting one end of the first surrounding portion and one end of the second surrounding portion, with two ends of the second U-shaped protruding ear respectively connecting another end of the first surrounding portion and another end of the second surrounding portion, with the first U-shaped protruding ear having a first opening and the second U-shaped protruding ear having a second opening, with the heat pipe having a heat dissipating end and a heat absorbing end, and with the heat dissipating end opposite to the heat absorbing end;

inserting the heat dissipating end into the through hole and the collar portion;

punching the collar portion to shrink the first opening of the first U-shaped protruding ear and the second opening of the second U-shaped protruding ear; and fixing the heat dissipating end in a tight-fitting manner with the collar portion.

4. The method of claim 3, wherein the first U-shaped protruding ear is opposite to the second U-shaped protruding ear.

5. The method of claim 3, wherein the heat dissipating fin further comprises a recess formed on the fin body, and wherein the method further comprises:

fixing the heat absorbing end in the recess.

\* \* \* \* \*